United States Patent
Young et al.

(10) Patent No.: US 7,760,026 B2
(45) Date of Patent: Jul. 20, 2010

(54) SWITCHED CAPACITOR VOLTAGE CONVERTER FOR A POWER AMPLIFIER

(75) Inventors: James P. Young, Cedar Rapids, IA (US); Ying Shi, Sunnyvale, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/394,211

(22) Filed: Feb. 27, 2009

(65) Prior Publication Data

US 2009/0224834 A1    Sep. 10, 2009

Related U.S. Application Data

(60) Provisional application No. 61/033,802, filed on Mar. 5, 2008.

(51) Int. Cl.
*H03F 3/04* (2006.01)
(52) U.S. Cl. .................................... 330/297; 330/296
(58) Field of Classification Search ............... 330/297, 330/9, 285, 296
See application file for complete search history.

(56) References Cited

U.S. PATENT DOCUMENTS 7,173,491 B2 * 2/2007 Bocock et al. ............ 330/285
7,298,214 B2 * 11/2007 Lee et al. ................. 330/297
7,372,333 B2 * 5/2008 Abedinpour et al. ....... 330/297
7,609,114 B2 * 10/2009 Hsieh et al. .............. 330/297

OTHER PUBLICATIONS

Noriaki Hara et al., A New Ring Type Switched-Capacitor DC-DC Converter with Low Inrush Current and Low Ripple; Kumamoto National College of Technology, Kumamoto 861-1102, Japan; pp. 1536-1542.
Mingliang Liu, Demystifying switched cap Circuits; p. 240.
Mengzhe Ma, Design of High Efficiency Step-Down Switched Capacitor DC/DC Converter, Oregon State University, May 2003.

* cited by examiner

*Primary Examiner*—Henry K Choe

(57) ABSTRACT

A voltage converter includes a plurality of capacitors and corresponding first switch elements, the capacitors coupled in series and arranged to each charge to a voltage level during a first clock period, the voltage level determined by a supply voltage level, the number of capacitors and a value of each capacitor; and a plurality of second switch elements configured to cause the plurality of capacitors to be connected in parallel and to discharge into an output capacitor during a second clock period, the output capacitor charged to a discrete voltage output level so that the output capacitor provides the discrete voltage output level, wherein the discrete voltage output level is less than the supply voltage level and wherein the discrete voltage output level is used to develop a bias signal that is supplied to a power amplifier element.

20 Claims, 9 Drawing Sheets

US 7,760,026 B2

SWITCHED CAPACITOR VOLTAGE CONVERTER FOR A POWER AMPLIFIER

CROSS-REFERENCE TO RELATED APPLICATION

This application claims priority to and the benefit of the filing date of co-pending U.S. Provisional Patent Application No. 61/033,802, filed on Mar. 5, 2008, entitled "Switched-Capacitor Voltage Converter For Power Amplifier Applications," the entire disclosure of which is hereby incorporated herein by reference.

BACKGROUND

Portable communication devices, such as cellular telephones, personal digital assistants (PDAs), WiFi transceivers, and other communication devices transmit and receive communication signal at various frequencies that correspond to different communication bands and at varying power levels. A power amplifier module, generally comprising one or more amplification stages, is used to transmit the communication signals. A radio frequency (RF) power amplifier system may include multiple amplification stages, and, in some applications, multiple amplification paths. The efficiency of the power amplifier system is generally determined by a number of factors, and to a large degree, determines the amount of power consumed by the power amplifier system.

Various ways of measuring and determining the efficiency of the power amplifier are available. One measure of power amplifier efficiency is referred to as "power added efficiency," abbreviated as PAE. The PAE of a power amplifier is dependent upon a number of factors including, but not limited to, the number of power amplification paths if the power amplifier system is a dual mode power amplifier, the load impedance at the output of the power amplifier path or paths, impedance matching between multiple stages, and other factors. In a power amplifier that is capable of transmitting at multiple power levels, one method to improve the PAE at lower power is to reduce the bias voltage of the collector terminal (or drain terminal, if the power amplifier is implemented as a field effect transistor (FET) device) of the power amplifier. This can be done in conjunction with adjusting the bias voltage of the base terminal (or gate terminal of a FET device) of the power amplifier. The bias voltage for the collector is typically provided by a voltage converter that can provide a continuous range of output values.

Unfortunately, a voltage converter that is capable of providing a continuous range of output values usually contains lossy inductive elements, and can be overly complex in applications where a limited number of discrete output values may suffice.

Therefore, it is desirable to maximize the PAE of a power amplifier system over a range of power levels, without sacrificing the linearity and performance of the power amplifier system over the range of power output levels.

SUMMARY

Embodiments of a voltage converter include a plurality of capacitors and corresponding first switch elements, the capacitors coupled in series and arranged to each charge to a voltage level during a first clock period, the voltage level determined by a supply voltage level, the number of capacitors and a value of each capacitor; and a plurality of second switch elements configured to cause the plurality of capacitors to be connected in parallel and to discharge into an output capacitor during a second clock period, the output capacitor charged to a discrete voltage output level so that the output capacitor provides the discrete voltage output level, wherein the discrete voltage output level is less than the supply voltage level and wherein the discrete voltage output level is used to develop a bias signal that is supplied to a power amplifier element.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
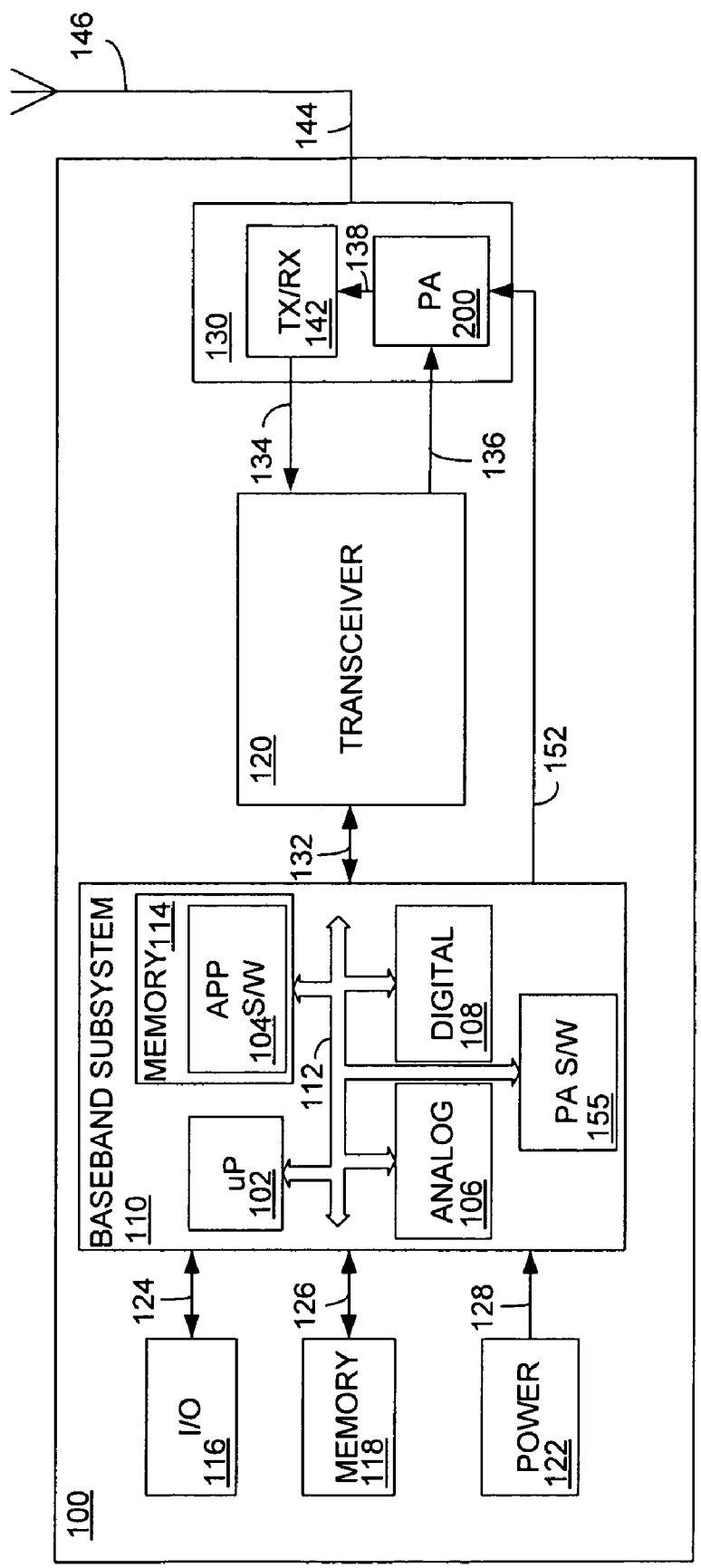
FIG. 1 is a block diagram illustrating a simplified portable communication device.

Although described with particular reference to a portable communication device, such as a portable cellular telephone or a personal digital assistant (PDA), the switched capacitor voltage converter for a power amplifier, also referred to as the switched capacitor voltage converter, can be used in any device or system that amplifies a transmit signal using a power amplifier. The switched capacitor voltage converter for a power amplifier can be implemented as part of an integrated module that contains other circuit elements, or can be implemented as a discrete module. Embodiments of the switched capacitor voltage converter can be particularly useful when operating with a power amplifier in a communication device employing code division multiple access (CDMA) and wideband code division multiple access (WCDMA) using a spread-spectrum modulation scheme or in long term evolution (LTE) for the third generation partnership project (3GPP), using orthogonal frequency division multiplexing (OFDM). Further, embodiments of the switched capacitor voltage converter can be used when operating with a power amplifier in a communication device employing global system for mobile communications (GSM), general packet radio service (GPRS), and enhanced data rates for GSM evolution (EDGE) using, for example, Gaussian mean shift keying (GMSK), or related modulation schemes.

The switched capacitor voltage converter for a power amplifier can be implemented in hardware, and, in an embodiment, can be controlled by software or firmware components. When implemented in hardware, the switched capacitor voltage converter for a power amplifier can be implemented using specialized hardware elements and control logic. When control components of the switched capacitor voltage converter for a power amplifier are implemented, at least partially in software, or implemented in a system that employs software control of various elements or components, the software portion can be used to precisely control the various components of the switched capacitor voltage converter for a power amplifier. The software can be stored in a memory and executed by a suitable instruction execution system (microprocessor). The hardware implementation of the switched capacitor voltage converter for a power amplifier can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the switched capacitor voltage converter for a power amplifier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable communication device 100. In an embodiment, the portable communication device 100 can be a portable cellular telephone. Embodiments of the switched capacitor voltage converter for a power amplifier can be implemented in any device having an RF transmitter, and in this example, are implemented in a portable communication device 100. The portable communication device 100 illustrated in FIG. 1 is intended to be a simplified example of a cellular telephone and to illustrate one of many possible applications in which the switched capacitor voltage converter for a power amplifier can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other device or system that allows a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100. In an embodiment, the power source can be a battery that provides a nominal voltage output of approximately 3.0 volts (V). However, the output voltage range of the power source can range from approximately 1.0 to 5.0 V.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the control logic of the switched capacitor voltage converter for a power amplifier are implemented in software, then the baseband subsystem 110 also includes power amplifier software 155, which may cooperate with control logic that can be executed by the microprocessor 102, or by another processor, to control at least some aspects of the operation of the switched capacitor voltage converter and/or the power amplifier 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 200. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 200. As will be described in detail below, the power amplifier 200 can be implemented to include a switched capacitor voltage converter for a power amplifier that efficiently provides one or more discrete voltage values to the power amplifier elements within the power amplifier 200. The output of the power amplifier 200 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides one or more control signals to the power amplifier 200 over connection 152. Connection 152 can be implemented as discrete connections, or as a bus having multiple signals. In an embodiment, a power, or mode selection, signal, a power amplifier enable signal, one or more reference voltage levels, and other control signals for one or more switch elements are provided over connection 152 to the power amplifier 200.

Figure 2:
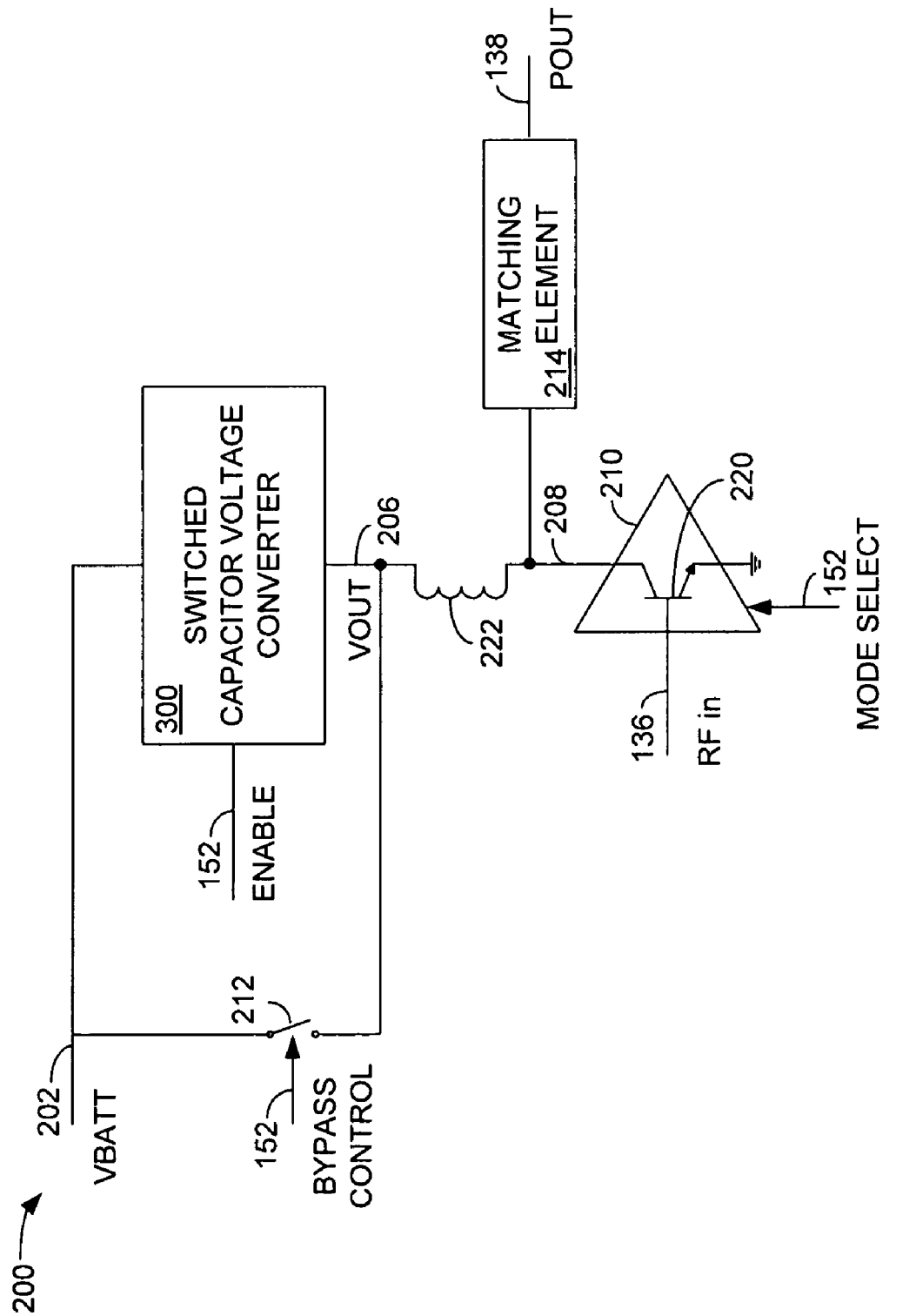
FIG. 2 is a simplified block diagram illustrating an embodiment of a power amplifier system that incorporates a switched capacitor voltage converter for a power amplifier.

FIG. 2 is a simplified block diagram illustrating an embodiment of a power amplifier system 200 that incorporates a switched capacitor voltage converter for a power amplifier.

The power amplifier system 200 generally includes a power amplifier element 210, an embodiment of the switched capacitor voltage converter 300, and an output matching element 214. As known to those skilled in the art, the power amplifier element 210 generally includes one or more power amplification stages, in certain embodiments the operation of which can be controlled by a mode select signal supplied over connection 152. In the embodiment shown in FIG. 2, the power amplifier element 210 is shown as including a single power amplifier stage 220. The power amplifier stage 220 is illustrated herein as a heterojunction bipolar transistor (HBT), in which the base terminal receives the radio frequency (RF) input signal at connection 136, the emitter terminal is grounded, and the collector terminal provides the output of the power amplifier element 210 on connection 208. In an embodiment, the output on connection 208 represents the collector current of the power amplifier stage 220. The output of the switched capacitor voltage converter 300 on connection 206 is connected to the collector terminal 208 of the power amplifier stage 220 through an inductance 222. The inductance 222 can be an inductor, or can be any component that provides an inductance. The inductance 222 functions as a direct current (DC) feed for the power amplifier element 210. The inductance 222 can also function as part of the matching element 214. In alternative embodiments, the power amplifier stage 210 may include a plurality of power amplifier stages, and may also be implemented using field effect transistor (FET) technology, in which the gate terminal would receive the RF input signal on connection 136, the drain terminal would provide the power amplifier output on connection 208 and would be coupled to the output of the switched capacitor voltage converter 300 via the inductance 222, and in which the source terminal would be grounded.

The switched capacitor voltage converter 300 receives a battery voltage signal over connection 202 and provides an output over connection 206. As described above, the voltage output, VOUT, on connection 206 is provided to the collector terminal 208 of the power amplifier stage 220 via the inductance 222. In an embodiment, an enable signal is provided to the switched capacitor voltage converter 300 from the baseband subsystem 110 (FIG. 1) over connection 152. In an embodiment in which it is desirable to provide full power output from the power amplifier element 210, a bypass control signal is supplied from the baseband subsystem 110 via connection 152 to a bypass switch 212. Closing the bypass switch 212 provides full battery voltage to the collector terminal of the power amplifier stage 220 at connection 208. However, in many instances it is desirable to have an output power from the power amplifier element 210 that is below the maximum possible power that can be provided. For example, in a multi-mode power amplifier, different power levels may be provided by different transmit architectures or methodologies. Alternatively, different power levels may be desired based on the proximity of the portable communication device to a base station or other factors. In operating conditions where less than maximum power, or reduced power is appropriate, also referred to as "back-off" power, it is desirable to maintain power added efficiency (PAE) as high as possible. In such embodiments, the switched capacitor voltage converter 300 can efficiently provide one or more discrete voltage output levels at connection 206, without the use of an internal lossy inductive element, as will be described below. These discrete voltage output levels are each at a level less than the voltage, VBATT.

For example, in an embodiment in which the power amplifier element 210 is operating in a CDMA or a WCDMA application, there is a relatively high probability that the power output of the power amplifier element will be close to 0 dBm. In such an implementation, it is desirable that the switched capacitor voltage converter be capable of dividing VBATT by, for example, 1/3, 1/4 and 1/5. Alternatively, in an embodiment in which the power amplifier element 210 is operating at less than maximum power level for a GSM, GPRS, or EDGE application, it is desirable that the switched capacitor voltage converter be capable of dividing VBATT by other ratios, such as, for example, 1/2 or other ratios. A voltage converter that provides an output voltage that is less than the input voltage is sometimes referred to as a "buck" voltage converter. As will be described below, the switched capacitor voltage converter 300 can provide any of these discrete voltage output levels.

The output of the power amplifier element 210 on connection 208 is provided to a matching element 214. As known to those skilled in the art, the matching element 214 alters the impedance presented to connection 208 to match the impedance present on connection 138, over which the RF output signal, also referred to a POUT, is provided from the power amplifier system 200.

FIGS. 3A and 3B are schematic diagrams collectively illustrating an embodiment of a switched capacitor voltage converter for a power amplifier in two states of operation. FIGS. 3A and 3B illustrate an embodiment of a switched capacitance voltage converter that can divide the voltage VBATT by three. However, other implementations are possible in which discrete values of VBATT/2, VBATT/3, VBATT/4, VBATT/5, and other discrete values are possible.

FIG. 3A shows an embodiment of a switched capacitor voltage converter 300 in a first mode of operation. The switched capacitor voltage converter 300 includes a capacitor 302, a capacitor 304, and a capacitor 306. As used herein, the term "capacitor" refers to a physical or discrete capacitor, or any other circuit element that can provide a capacitance. The capacitors 302, 304 and 306 can be referred to herein as "sampling" capacitors because they sample the battery voltage, VBATT, on connection 202. In the embodiment shown in FIG. 3A, the values of the capacitors 302, 304 and 306 are substantially equal. The number of capacitors is determined by the number of discrete voltage outputs desired. The number of discrete voltage outputs corresponds to a voltage divide ratio. For example, in the embodiment shown in FIGS. 3A and 3B, the voltage, VBATT on connection 202 will be divided by three. As will be described in more detail below, additional implementations of the switched capacitor voltage converter 300 can be included in the power amplifier system 200 so that other divide ratios are possible, thus providing other discrete voltage output levels. Further, the selected divide ratio can be dynamically determined based on desired power amplifier output levels. Other embodiments of the switched capacitor voltage converter 300 may include four (4), five (5) or more or fewer sampling capacitors. Further, in an embodiment in which it is desirable to apply battery voltage to the power amplifier, a bypass switch element 301, which is similar to the bypass switch 212 described above, can be controlled to connect the voltage, VBATT, directly to an output node on connection 206.

A switch element 308 connects the capacitor 302 to battery voltage, VBATT, on connection 202. A switch element 312 connects the capacitor 302 to the capacitor 304, and a switch element 314 connects the capacitor 306 to ground. The switch elements 308, 312 and 314 can be implemented using various switching technologies, and, in a preferred embodiment, are implemented as low loss, highly efficient switch elements, using, for example, field effect transistor (FET) devices, or other transistor devices.

A switch element 316 is connected between the capacitor 302 and a capacitor 336, a switch element 318 is connected between the capacitor 304 and the capacitor 336, and a switch element 322 is connected between the capacitor 306 and the capacitor 336. The switch elements 316, 318 and 322 can be similar to the switch elements 308, 312 and 314. The capacitor 336 is referred to herein as an output capacitor, and, as will be described below, is charged by the capacitors 302, 304 and 306 to provide the voltage output VOUT, on connection 206. Also schematically shown is the current load, IOUT, represented by a current source 338.

A switch element 324 is connected between the capacitor 302 and a ground, and a switch element 326 is connected between the capacitor 304 and ground. The switch elements 324 and 326 are similar to the switch elements 316, 318 and 322.

In the embodiment shown in FIG. 3A, the switch elements 308, 312 and 314 are illustrated as being in the "closed" position, and the switch elements 316, 318, 322, 324, and 326 are illustrated as being in the "open" position. In accordance with an embodiment of the switched capacitor voltage converter 300, the switch elements 308, 312 and 314 are controlled using a clock signal, CK1, having a first phase, and the switch elements 316, 318, 322, 324 and 326 are controlled by a clock signal, CK2, having a second phase. The clock signal CK1 (having the first phase) is illustrated using trace 310 and the clock signal CK2 (having the second phase) is illustrated using trace 320. The phase of the first clock signal, CK1, 310 does not overlap the phase of the second clock signal CK2 320. Stated another way, when the switches 308, 312 and 314, which are controlled by the clock signal CK1 are closed, the switches 316, 318, 322, 324 and 326, which are controlled by the clock signal CK2, are open. Similarly, as shown in FIG. 3B, when the switches 308, 312 and 314 are open, the switches 316, 318, 322, 324 and 326 are closed.

The frequency, f, of the clock signal CK1 is substantially equal to the frequency, f, of the clock signal CK2; however, the two clock signals are always sufficiently out of phase such that they do not overlap and cause the switches 308, 312 and 314 to be closed at the same time that the switches 316, 318, 322, 324 and 326 are closed. In some embodiments, the frequency, f, can vary. In the embodiment shown in FIG. 3A in which three sampling capacitors are illustrated, the battery voltage VBATT on connection 202 will be divided by three, such that the output, VOUT, on connection 206 will be VBATT/N, where N=3. Other numbers of capacitors will result in different divide ratios to provide other discrete voltage levels on connection 206, as described above. In addition, there will likely be at least a small voltage drop, referred to as $\Delta V$, due to loading of the power amplifier element 210 (FIG. 2), such that the output voltage, VOUT, will be (VBATT/N)-$\Delta V$. In an ideal embodiment, the value of $\Delta V$ will equal IOUT/(f*N*C), where f is the frequency of the clock signals, CK1 and CK2, N is the number of sampling capacitors, and C is the capacitance value of the sampling capacitors 302, 304 and 306.

As shown in FIG. 3A, when the switches 308, 312 and 314 are closed, the three sampling capacitors 302, 304 and 306, each having substantially the same capacitance value, are connected in series and are each charged to a voltage value of VBATT/3, in this example. As shown in FIG. 3B, the clock signal CK1 causes the switches 308, 312, and 314 to open while the clock signal CK2 causes the switches 316, 318, 322, 324 and 326 to close, thus connecting the sampling capacitors 302, 304 and 306 in parallel. In FIG. 3B, the capacitors 302, 304 and 306 are also connected to the output on connection 206, and thus charge the output capacitor 336 to the value of (VBATT/N)-$\Delta V$, where N=3 in this example. Accordingly, the average output voltage, VOUT at connection 206 equals (VBATT/N)-$\Delta V$, where $\Delta V$=IOUT/(f*N*C), as described above.

In addition, a ripple voltage is also present on connection 206. The ripple voltage, VRIPPLE, equals IOUT/(f*COUT), where COUT is the capacitance of the output capacitor 336. In this embodiment, the current output IOUT 338 is the loading current of the power amplifier element 210 (FIG. 2) and f is the frequency of the clock signals CK1 and CK2. Raising the frequency, f, of the clock signals CK1 and CK2 reduces the output voltage ripple. In an embodiment, the frequency, f, can range from approximately 10 kHz to approximately 100 MHz, or greater.

Further, the overall efficiency of the switched capacitor voltage converter 300 can be improved by choosing a sufficiently large value for the output capacitor 336, the sampling capacitors 302, 304 and 306, and the frequency f. Further, the number of sampling capacitors that are implemented can vary according to the battery voltage and the desirable output voltage.

Figure 3:
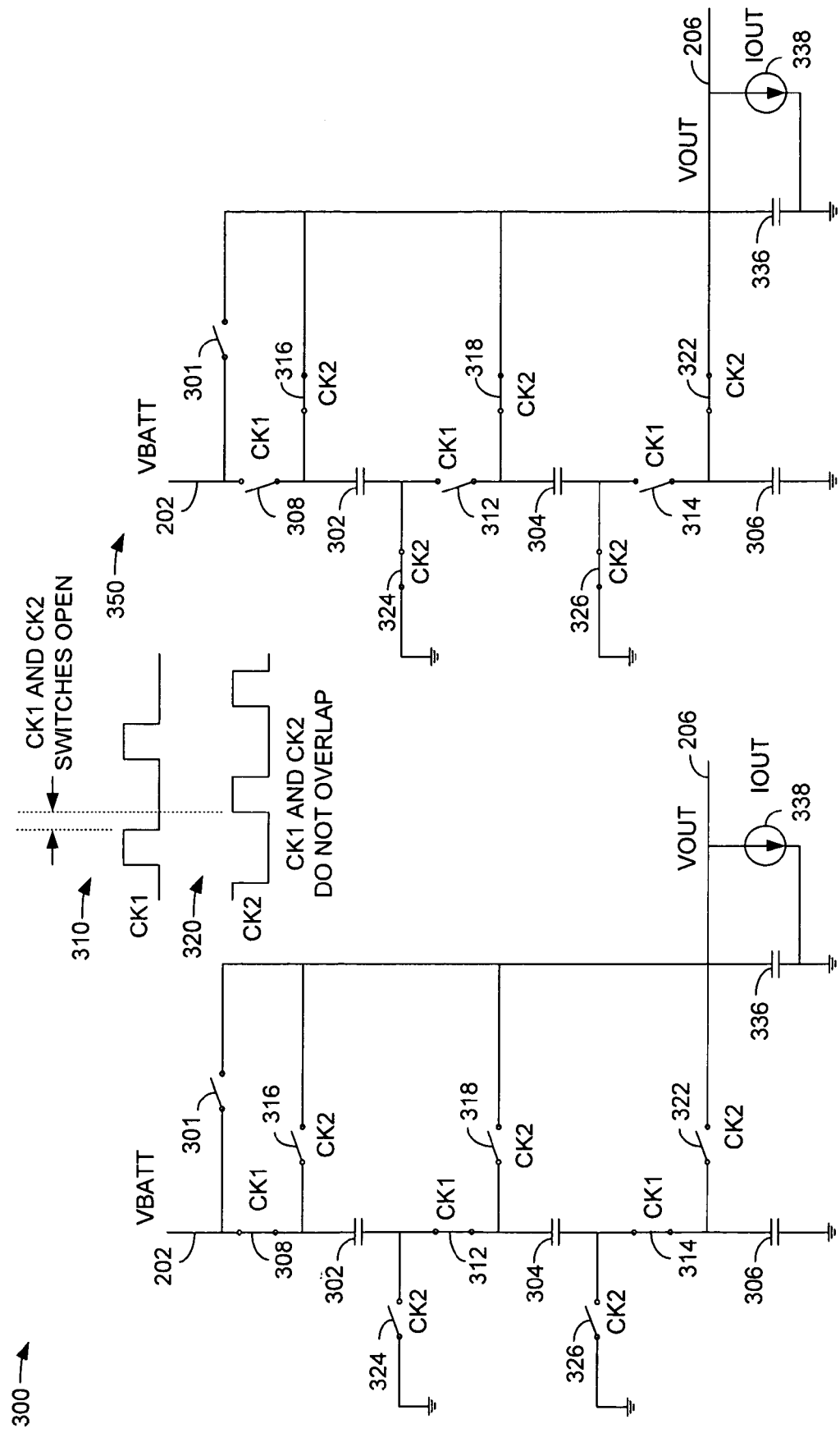
FIGS. 3A and 3B are schematic diagrams collectively illustrating an embodiment of a switched capacitor voltage converter for a power amplifier in two states of operation.
Figure 4:
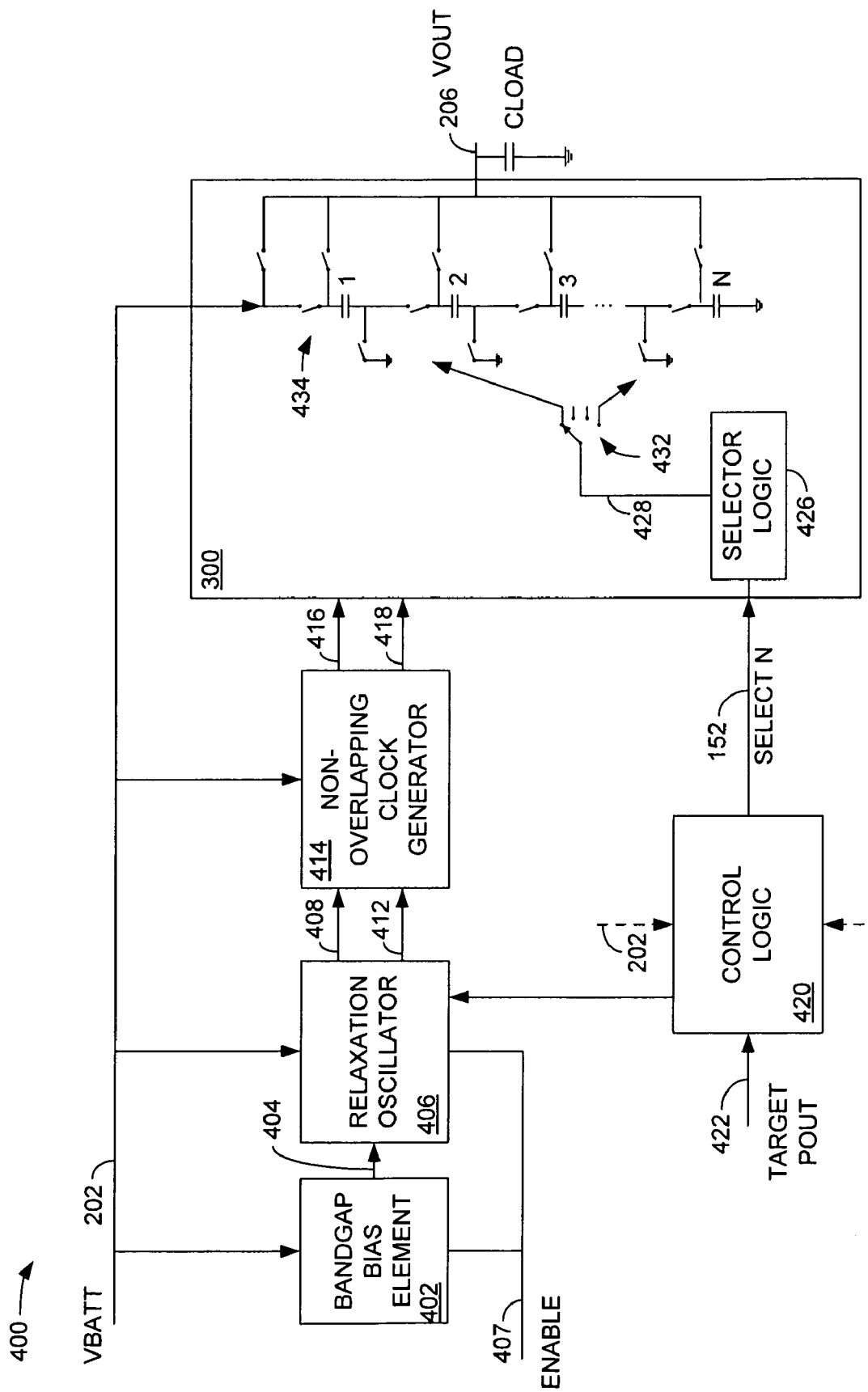
FIG. 4 is a block diagram illustrating an embodiment of a system for determining a number of sampling capacitors for the switched capacitor voltage converter of FIG. 3.

FIG. 4 is a block diagram illustrating an embodiment of a system for determining a number of sampling capacitors that the switched capacitor voltage converter of FIG. 3 will implement to provide the discrete voltage, VOUT. A bandgap bias element 402 receives VBATT and generates a bandgap bias voltage on connection 404. The bandgap bias voltage is generated based on the material system that is used to form the die (not shown) on which the switched capacitor voltage converter 300 is fabricated. The bandgap voltage signal on connection 404 is provided to a relaxation oscillator 406. The relaxation oscillator 406 also receives the voltage VBATT and provides two clock signals on connections 408 and 412 to a non-overlapping clock generator 414.

A relaxation oscillator is an oscillator in which a capacitor is charged gradually and then rapidly discharged. A relaxation oscillator is a repeating circuit which achieves its repetitive behavior from the charging of a capacitor to some event threshold. The event discharges the capacitor, and its recharge time determines the repetition time of the event, as known in the art.

The non-overlapping clock generator 414 provides the non-overlapping clock signals, CK1 and CK2, to the switched capacitor voltage converter 300 on connections 416 and 418, as described above.

As shown in FIG. 4, a control logic 420 receives the target RF power output level, POUT, on connection 422. The target power output, POUT, is the power output desired to be provided by the power amplifier 200 (FIG. 2). The control logic 420 can be implemented in hardware, software or combination of hardware and software, can be implemented directly on the same die as the power amplifier system 200, or can be implemented in the baseband subsystem 110 as part of the power amplifier software 155.

In an embodiment, the control logic 420 can be implemented as a lookup table that provides a signal on connection 152 to the switched capacitor voltage converter 300. The signal on connection 152 corresponds to the number, N, of sampling capacitors that the switched capacitor voltage converter 300 will use to divide the voltage VBATT and provide the voltage VOUT. For example, in a CDMA or a WCDMA application when the desired POUT is between 28 dBm and 14 dBm, the control logic 420 would select N=1, where N=1 is intended to represent the bypass mode. When the desired POUT is below 14 dBm, the control logic 420 would select N=3. Therefore, if N=3 and if VBATT were 3.3 volts (V), the output VOUT of the switched capacitor voltage converter 300 would be nominally 1.1V When the desired POUT is 3 dBm, then the control logic 420 would select N=4.

In an alternative embodiment, the control logic 420 can receive additional information to more accurately determine N. For example, the control logic 420 can optionally receive VBATT over connection 202, and can optionally receive additional information over connection 423. Examples of the additional information received over connection 423 include, but is not limited to, the desired transmit frequency, $f_{tx}$, which is the transmission frequency of the transmit signal, the temperature, t, of the communication device 100, the type of modulation being transmitted, or other information relating to the communication device or the transmission environment in which the communication device 100 operates.

The additional information, such as VBATT, $f_{tx}$, temperature, modulation type, etc., can be used to accurately determine N. For example, for a 3 dBm POUT, the best value for VOUT is a specific voltage, for example, 0.6 volts (V). Based on the discharge voltage of the battery, the control logic 420 could choose the value of N so that the voltage is maintained at 0.6V or greater. However, for the best RF performance, the voltage should not drop below 0.6V, and to minimize current consumption, thus extending battery life, the control logic 420 can use VBATT to select the value of N to provide the lowest value of VOUT possible.

In an embodiment, the control logic 420 computes the value of "N" appropriate to the voltage VBATT and the target power output POUT, and provides a signal representing the desired value for "N" as a output signal over connection 152 to the switched capacitor voltage converter 300. The number N corresponds to the number of sampling capacitors 302, 304 and 306 (e.g., three as shown in FIGS. 3A and 3B, and up to "N" sampling capacitors as shown in FIG. 4). For example, if the battery voltage, VBATT on connection 202 is 3.3V and N=3, then the output, VOUT, will be 1.1V. However, other values of N are possible.

The switched capacitor voltage converter includes selector logic 426. The selector logic 426 receives the desired value for N and provides a selection signal over connection 428 to a switching element 432. The switching element 432 selects the desired number of sampling capacitors from an array 434. The array 434 can include, for example, a number of sampling capacitors that are selectable by the switching element 432 based on the value of N. In an embodiment, five sampling capacitors can be provided in the array 434, allowing one (1), two (2), three (3), four (4) or five (5) sampling capacitors to be used to divide the voltage VBATT, to obtain VOUT. Other numbers of sampling capacitors are also possible.

In an embodiment, the switching element 432 can be implemented using discrete switches that can direct any number of the sampling capacitors in the array 434 to be enabled to divide the voltage VBATT. In an alternative embodiment, the switching element 432 can be logically implemented using the switches 316, 318, 322, 324 and 326, shown in FIG. 3A and FIG. 3B for a three sampling capacitor example, to enable any number of the sampling capacitors in the array 434 up to the maximum number, N, of sampling capacitors in the array 434. For example, using FIG. 3A as an example, the switch 326 can be closed, thus connecting the sampling capacitor 304 to ground, and causing the voltage VBATT to be divided by the sampling capacitors 302 and 304, corresponding to N=2.

Further, the control logic 420 can operate continuously to dynamically analyze the battery voltage, VBATT, the desired power output, POUT, or other factors mentioned above, to dynamically determine the appropriate divide ratio. In an embodiment, the switched capacitor voltage converter 300 includes circuitry to divide the battery voltage, VBATT, by factors of /1, /2, /3, /4, and /5, to provide up to five discrete voltage levels to the power amplifier element 210 (FIG. 2). However, more or fewer divide ratios are possible.

In a CDMA or a WCDMA system in which the probability of a power amplifier power output is often near 0 dBm, the switched capacitor voltage converter 300 is particularly well-suited to provide divide ratios of VBATT/2. VBATT/3, VBATT/4 and VBATT/5 because at such low power, the corresponding VOUT is typically a fraction of VBATT. In such an application, the sampling-capacitor based architecture that uses no inductive element is particularly efficient at providing the desired fractional discrete voltage levels at lower collector voltages and at lower "backed-off" power levels. When compared with the switched capacitor voltage converter 300 at low power output levels, i.e., when in a reduced power operation mode, a voltage converter that implements an inductive element at its output is significantly less efficient at such low output power levels. Further, to minimize losses and the "on resistance" (RON) of switches in a voltage converter that uses an inductive element, the switches that effect the switching must be large, and have corresponding large gate capacitance values, when implemented as FET devices. This results in additional circuitry (not shown) to control the switches. In contrast, the switched capacitor voltage converter 300 is particularly efficient at low power levels because there is no inductive element, thus allowing smaller switch elements to be used, and allowing the circuitry to be implemented using a small die area, thus reducing cost.

Figure 5:
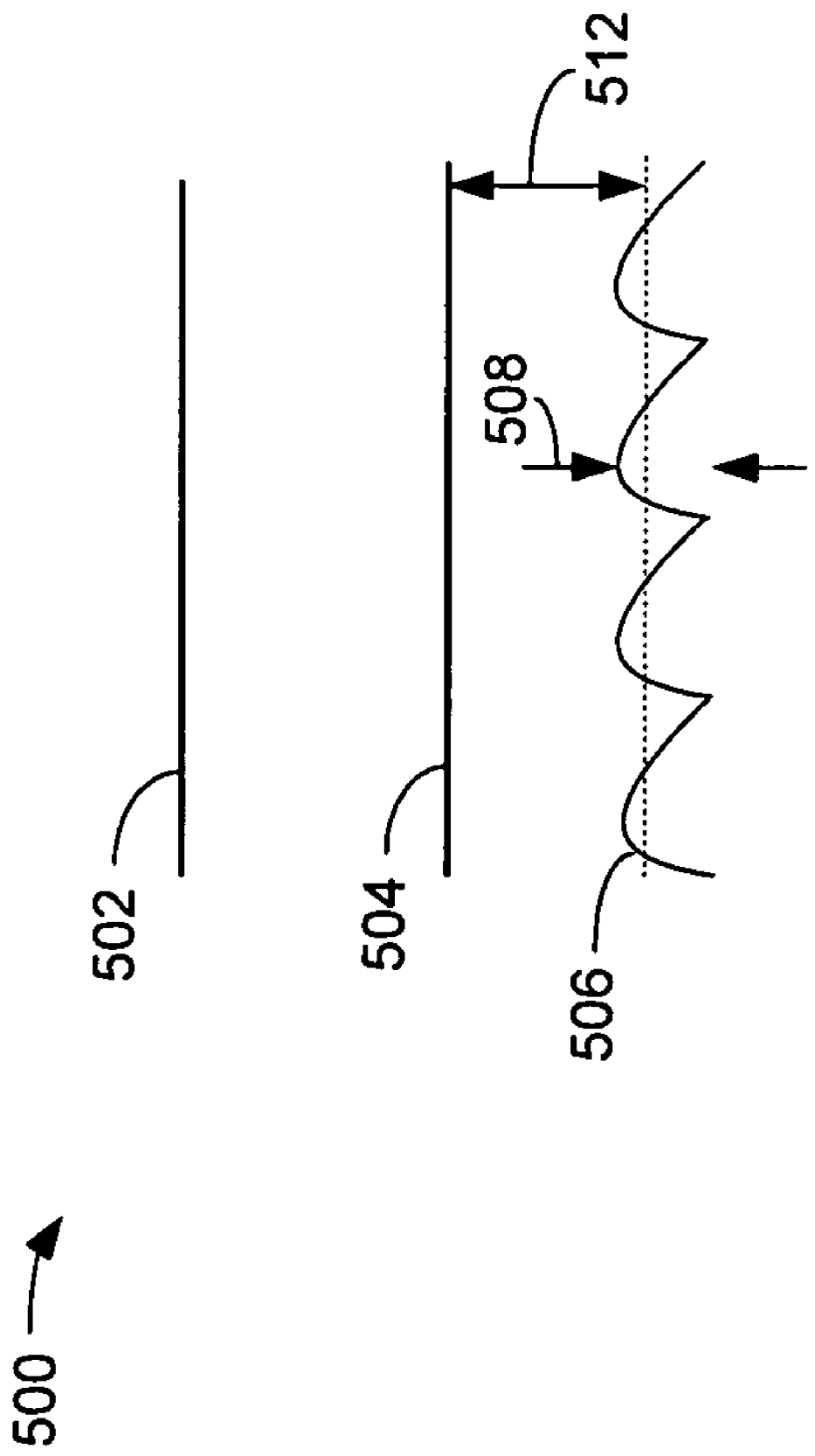
FIG. 5 is a graphical illustration showing the voltage output provided by the switched capacitor voltage converter of FIG. 3.

FIG. 5 is a graphical illustration showing the voltage output provided by the switched capacitor voltage converter of FIG. 3. The output voltage, VBATT, is illustrated using trace 502, the output voltage, VBATT/N, where N=3 in this example, is illustrated by trace 504 and the output voltage, VOUT, is illustrated by trace 506. The voltage drop between VBATT/N and VOUT, ΔV, is illustrated at 512 and the output voltage ripple, V RIPPLE, is illustrated at 508.

It is desirable to minimize the resistance of the switches 308, 312, 314, 316, 318, 322, 324 and 326, and thus reduce to the extent possible the ripple voltage. Generally, with respect to the core of the switched capacitor voltage converter, as shown for example in FIGS. 3A and 3B, a higher clock frequency, f, leads to higher efficiency, smaller voltage drop, ΔV, and smaller ripple voltage. However, with regard to the circuitry (not shown) that drives the switches (308, 312, 314, 316, 318, 322, 324 and 326) shown in FIGS. 3A and 3B, as the frequency, f, increases, the circuitry that drives the switches (308, 312, 314, 316, 318, 322, 324 and 326) consumes more power. Therefore, there is an optimal frequency, f, that provides maximum efficiency. Therefore, as the desired power output of the power amplifier element decreases, with a resultant reduction in the collector current of the power amplifier element and a corresponding reduction in the output of the switched capacitor voltage converter 300 (FIG. 3A and FIG. 3B), the frequency, f, of the clock signals CK1 and CK2 (FIG. 3A and FIG. 3B) is adjusted, or shifted, to an optimal value that maximizes switching efficiency. In an embodiment, the frequency, f, may range from approximately 2 MHz to approximately 500 KHz. In an embodiment, the frequency is reduced as the output voltage, VOUT, is reduced. In addition, the amount of ripple voltage, VRIPPLE, also influences the frequency, f.

Figure 9:
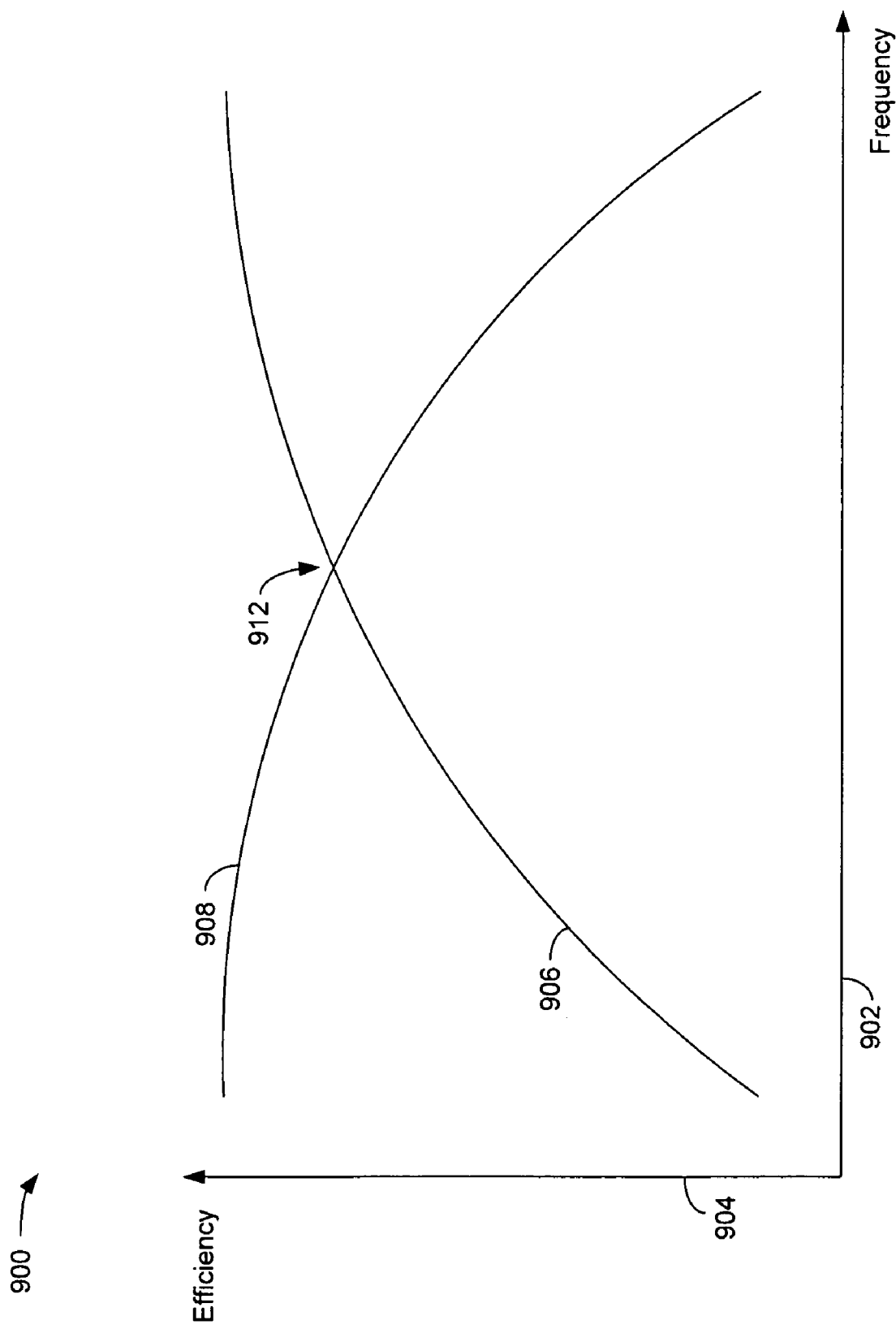
FIG. 9 is a graphical diagram conceptually illustrating the switching efficiency of an embodiment of the switched capacitor voltage converter.

An example of the efficiency of the switched capacitor voltage converter is shown in FIG. 9 as graphical illustration 900. The horizontal axis 902 represents the frequency, f, and the vertical axis 904 represents efficiency. The trace 906 represents the efficiency of the switches 308, 312, 314, 316, 318, 322, 324 and 326 shown in FIGS. 3A and 3B, ignoring the on resistance (RON) of the switches. As shown, a higher clock frequency, f, leads to higher efficiency, smaller voltage drop, ΔV, and smaller ripple voltage.

The trace 908 represents the efficiency of the circuitry (not shown) that drives the switches 308, 312, 314, 316, 318, 322, 324 and 326. As the frequency, f, increases, the circuitry that drives the switches 308, 312, 314, 316, 318, 322, 324 and 326 consumes more power. Therefore, there is an optimal frequency, f, illustrated at point 912, that provides maximum efficiency.

The ideal efficiency, assuming zero on resistance (RON) of the switches 308, 312, 314, 316, 318, 322, 324 and 326, of the switched capacitor voltage converter 300 is given by equation 1. The efficiency of the switched capacitor voltage converter 300 will degrade as the on resistance (RON) of the switches 308, 312, 314, 316, 318, 322, 324 and 326 increases.

Efficiency Loss1−η=ΔV/Vout

ΔV=Iload*T/(3C1)  (Eq. 1)

Figure 6:
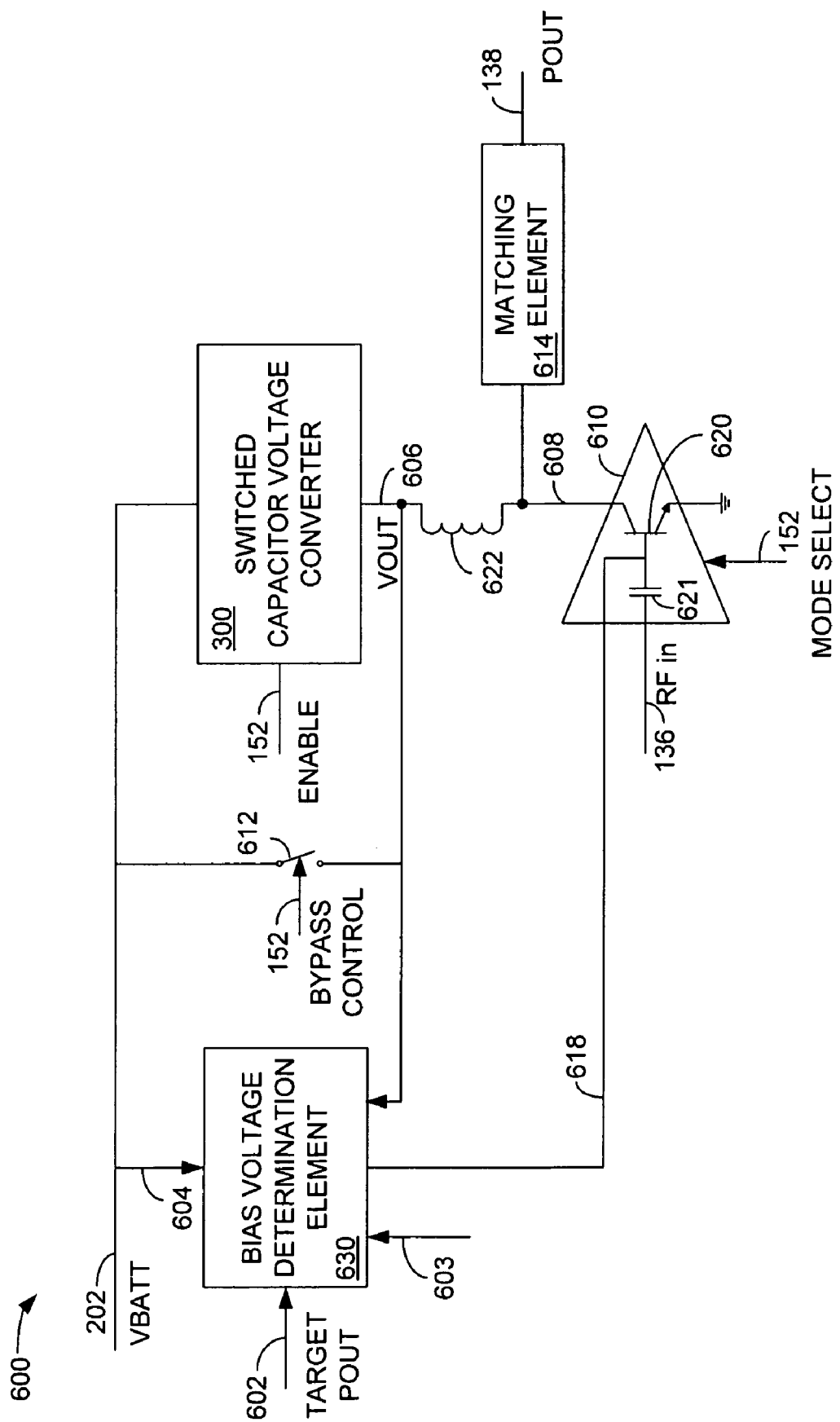
FIG. 6 is a schematic diagram illustrating an alternative embodiment of the switched capacitor voltage converter for a power amplifier of FIG. 3.

FIG. 6 is a schematic diagram illustrating an alternative embodiment of the switched capacitor voltage converter for a power amplifier of FIG. 3. The power amplifier system 600 shown in FIG. 6 is similar to the power amplifier system 200 shown in FIG. 2. Accordingly, elements in FIG. 6 that are similar to corresponding elements in FIG. 2 will be referred to using the nomenclature 6XX, where XX refers to the corresponding element in FIG. 2.

The power amplifier element 610 is illustrated using a power amplifier stage 620 that optionally includes a DC blocking capacitor 621 at its base terminal. The output of the switched capacitor voltage converter 300 is supplied from connection 606 to a bias voltage determination element 630. The bias voltage determination element 630 uses a number of factors to determine an appropriate bias signal level with which to bias the base terminal of the power amplifier stage 620.

In an embodiment, the bias voltage determination element 630 receives any combination of the desired power output POUT, over connection 602, VBATT over connection 604, VOUT over connection 606, and any of $f_{tx}$, temperature, modulation type, etc., over connection 603, to determine the level of the bias signal provided over connection 618. The bias voltage determination element 630 can be implemented in hardware, software or combination of hardware and software, can be implemented directly on the same die as the power amplifier system 200, or can be implemented in the baseband subsystem 110 as part of the power amplifier software 155.

The bias signal provided to the base terminal of the power amplifier stage 620 regulates the collector current, IOUT (FIGS. 3A and 3B), when the power amplifier stage 620 is implemented as a current saturation amplifier. In this manner, various factors can be used to control the bias applied to the power amplifier stage 620. Typically, the current, IOUT, would be reduced to minimize the power consumed by the power amplifier stage 620, while still maintaining sufficient current to maintain proper RF performance in the system application; for example, maintaining adjacent channel power ratio performance. Also, excessively high loading current due to an output mismatch condition is minimized.

Figure 7:
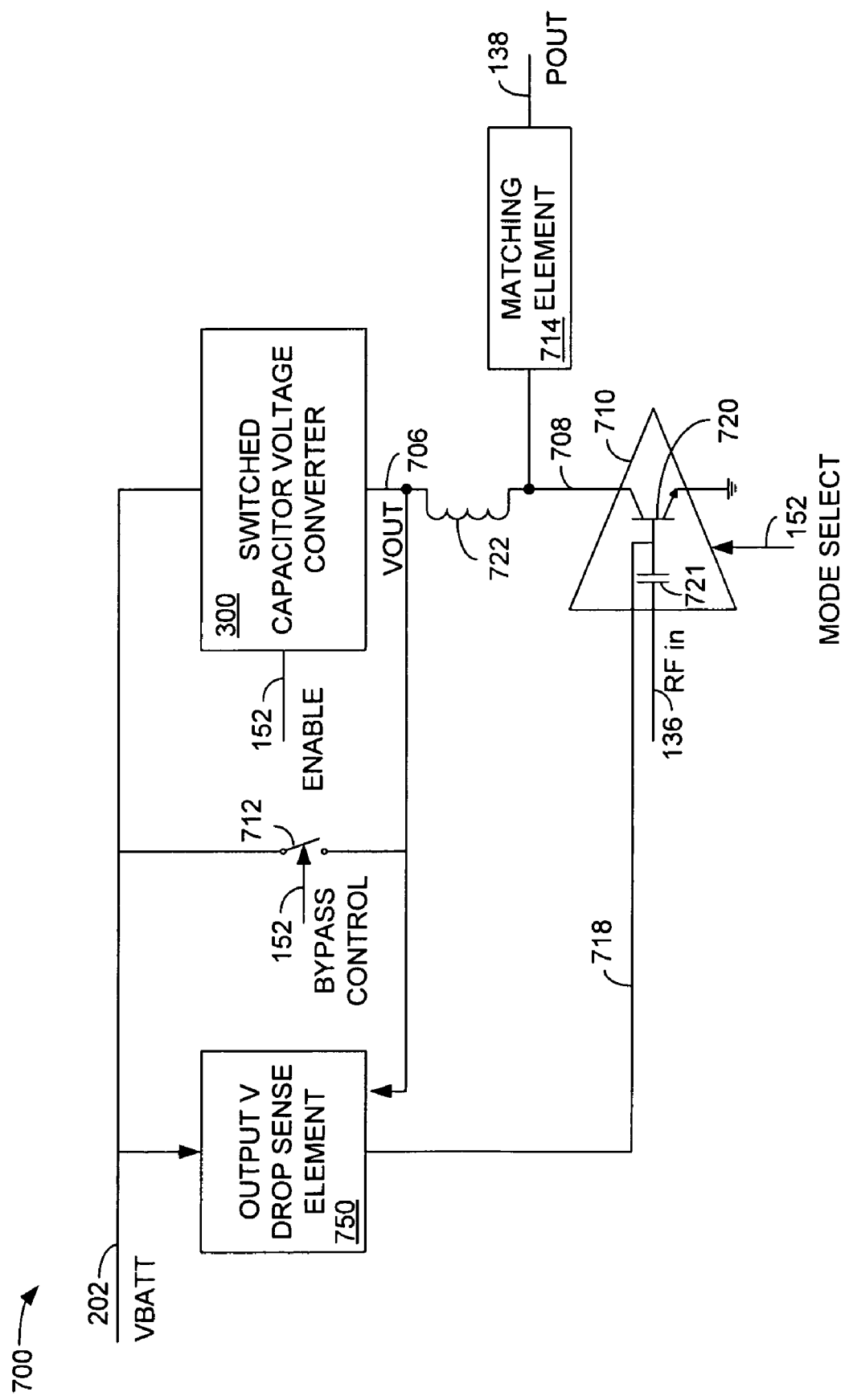
FIG. 7 is a schematic diagram illustrating an alternative embodiment of the switched capacitor voltage converter for a power amplifier of FIG. 6.

FIG. 7 is a schematic diagram illustrating an alternative embodiment of the switched capacitor voltage converter for a power amplifier of FIG. 6. The power amplifier system 700 shown in FIG. 7 is similar to the power amplifier system 600 shown in FIG. 6. Accordingly, elements in FIG. 7 that are similar to corresponding elements in FIG. 6 will be referred to using the nomenclature 7XX, where XX refers to the corresponding element in FIG. 6. Elements of the embodiment of the switched capacitor voltage converter 700 can be implemented along with elements of the switched capacitor voltage converter 600 of FIG. 6.

The power amplifier element 710 is illustrated using a power amplifier stage 720 that optionally includes a DC blocking capacitor 721 at its base terminal. The output of the switched capacitor voltage converter 300 is supplied from connection 706 to an output voltage drop sense element 750. The output voltage drop sense element 750 can be implemented separate from, or in addition to the bias voltage determination element 630 described in FIG. 6. The output voltage drop sense element 750 determines the amount of voltage drop across the switched capacitor voltage converter 300, ΔV (by determining (VBATT/N)−VOUT), generates a bias signal, and supplies the bias signal over connection 718 to the base terminal of the power amplifier stage 720. The value of ΔV is an indication as to the amount of current being drawn by the power amplifier element 720. The amount of current being drawn by the power amplifier element 720 is also at least partially dependent on the load at the output (POUT) of the power amplifier element 720. In this manner, the value of ΔV is an indicator of mismatch at the output of the power amplifier element 720, and can be used to develop the bias signal. For example, with a defined load (i.e., 50 ohm) at the output of the power amplifier element 720, an increase in the collector current on connection 708 can be an indicator that the impedance at the output of the power amplifier element 720 on connection 138 is dropping. An increase in collector current could be sensed by a change in the value of ΔV, which can be used to decrease the level of the bias signal on connection 718 to prevent the collector current from rising, thus maintaining a constant ΔV.

The bias signal on connection 718 is used to bias the base terminal of the power amplifier stage 720 to regulate the collector current, IOUT, when the power amplifier stage 720 is implemented as a current saturation amplifier. In this manner, the voltage difference between (VBATT/N) and VOUT is used in a feedback loop to scale and control the bias applied to the power amplifier stage 720 in response to the voltage drop, ΔV. In this manner, excessively high loading current due to an output mismatch condition is minimized.

Figure 8:
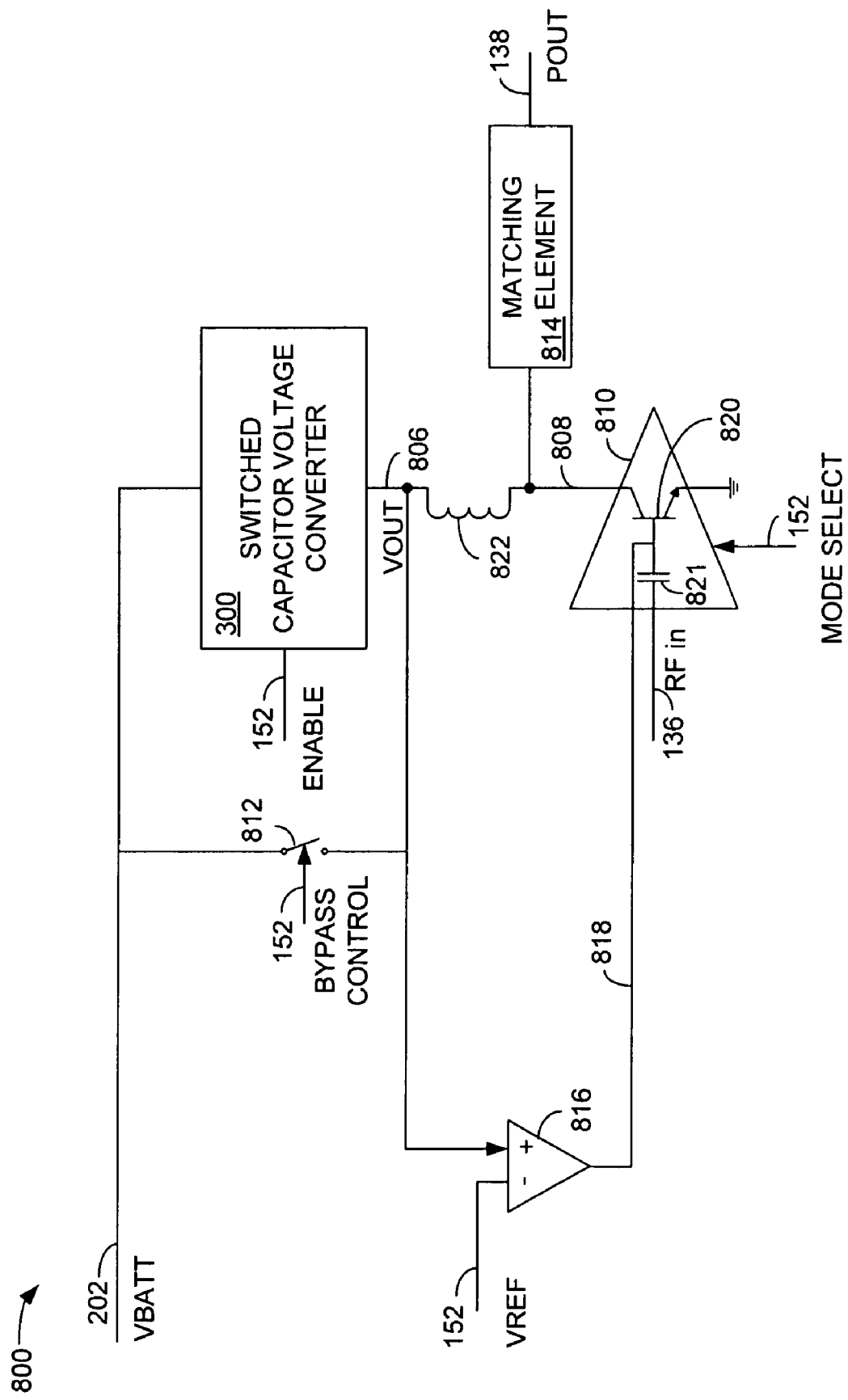
FIG. 8 is a schematic diagram illustrating another alternative embodiment of the switched capacitor voltage converter for a power amplifier of FIG. 6.

FIG. 8 is a schematic diagram illustrating another alternative embodiment of the switched capacitor voltage converter for a power amplifier of FIG. 6. A portion of the power amplifier system 800 shown in FIG. 8 is similar to the power amplifier system 700 shown in FIG. 7. Accordingly, elements in FIG. 8 that are similar to corresponding elements in FIG. 7 will be referred to using the nomenclature 8XX, where XX refers to the corresponding element in FIG. 7.

The power amplifier element 810 is illustrated using a power amplifier stage 820 that optionally includes a DC blocking capacitor 821 at its base terminal. The output of the switched capacitor voltage converter 300 is supplied from connection 806 to a non-inverting input of an operational amplifier 816. In an embodiment, the operation amplifier 816 can be a linear or non-linear amplifier, providing a corresponding output. A reference voltage signal, VREF, or control signal, is supplied over connection 152 to the inverting input of the operational amplifier 816.

The operational amplifier 816 determines the difference between the reference signal and the output of the switched capacitor voltage converter 300 and supplies an error signal on connection 818 to the base terminal of the power amplifier stage 820. The error signal on connection 818 scales with the level of the voltage, VOUT, and is used to bias the base terminal of the power amplifier stage 820 to regulate the collector current, IOUT, when the power amplifier stage 820 is implemented as a current saturation amplifier. In this manner, the voltage difference between VOUT and a reference voltage is used in a feedback loop to control the bias applied to the power amplifier stage 820.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of power amplifiers, communication devices and transceivers.

What is claimed is:

1. A power amplifier system, comprising:
a power amplifier element configured to provide a power output signal in response to a bias signal, the power output signal ranging in power from a full power output signal to a less than full power output signal; and
a switched capacitor voltage converter configured to provide at least one discrete voltage output level to the power amplifier element, the switched capacitor voltage converter comprising:
a plurality of capacitors and corresponding first switch elements, the capacitors coupled in series and arranged to each charge to a voltage level during a first clock period, the voltage level determined by a supply voltage level, the number of capacitors and a value of each capacitor; and
a plurality of second switch elements configured to cause the plurality of capacitors to be connected in parallel and to discharge into an output capacitor during a second clock period, the output capacitor charged to the discrete voltage output level, wherein the discrete voltage output level is less than the supply voltage level, and wherein the bias signal supplied to the power amplifier element is responsive to the discrete voltage output level.

2. The power amplifier system of claim 1, in which the plurality of capacitances is chosen from two, three, four and five.

3. The power amplifier system of claim 1, in which the first clock period and the second clock period include no time during which a first switch element and a second switch element are simultaneously closed, and in which a frequency of the first clock period and the second clock period is variable.

4. The power amplifier system of claim 1, further comprising a bypass switch configured to bypass the plurality of capacitors when the at least one discrete voltage output level is sought to be the supply voltage level.

5. The power amplifier system of claim 1, in which the power amplifier element operates in a communication system chosen from code division multiple access (CDMA), wideband code division multiple access (WCDMA), and long term evolution (LTE) for 3GPP (third generation partnership project).

6. The power amplifier system of claim 1, further comprising a control logic configured to determine the number of capacitors.

7. The power amplifier system of claim 6, wherein the control logic determines the number of capacitors based on factors chosen from a desired power output level, battery voltage, transmit frequency, temperature and modulation type.

8. The power amplifier system of claim 1, further comprising:
a bias voltage determination element configured to provide the bias signal to the power amplifier element, the bias signal determined using factors chosen from the discrete voltage output level, a desired power output level, battery voltage, transmit frequency, temperature and modulation type.

9. The power amplifier system of claim 1, further comprising an operational amplifier configured to compare the at least one discrete voltage output level against a reference signal, and provide the bias signal to the power amplifier element, where the bias signal represents a difference between the at least one discrete voltage output level and the reference signal.

10. The power amplifier system of claim 1, further comprising:
an output voltage drop sense element configured to determine a voltage drop of the discrete voltage output level across the switched capacitor voltage converter, and configured to provide the bias signal to the power amplifier element, where the bias signal is responsive to the voltage drop of the discrete voltage output level.

11. A voltage converter, comprising:
a plurality of capacitors and corresponding first switch elements, the capacitors coupled in series and arranged to each charge to a voltage level during a first clock period, the voltage level determined by a supply voltage level, the number of capacitors and a value of each capacitor; and
a plurality of second switch elements configured to cause the plurality of capacitors to be connected in parallel and to discharge into an output capacitor during a second clock period, the output capacitor charged to a discrete voltage output level so that the output capacitor provides the discrete voltage output level, wherein the discrete voltage output level is less than the supply voltage level and wherein the discrete voltage output level is used to develop a bias signal that is supplied to a power amplifier element.

12. The voltage converter of claim 11, in which the plurality of capacitors is chosen from two, three, four and five.

13. The voltage converter of claim 11, in which the first clock period and the second clock period include no time during which a first switch element and a second switch element are simultaneously closed, and in which a frequency of the first clock period and the second clock period is variable.

14. The voltage converter of claim 11, further comprising a bypass switch configured to bypass the plurality of capacitors when the at least one discrete voltage output level is sought to be the supply voltage level.

15. The voltage converter of claim 11, in which the power amplifier element operates in a communication system chosen from code division multiple access (CDMA), wideband code division multiple access (WCDMA), and long term evolution (LTE) for 3GPP (third generation partnership project).

16. The voltage converter of claim 11, further comprising a control logic configured to determine the number of capacitors.

17. The voltage converter of claim 16, wherein the control logic determines the number of capacitors based on factors chosen from a desired power output level, battery voltage, transmit frequency, temperature and modulation type.

18. The voltage converter of claim 15, further comprising:
a bias voltage determination element configured to provide the bias signal to the power amplifier element, the bias signal determined using factors chosen from the discrete voltage output level, a desired power output level, battery voltage, transmit frequency, temperature and modulation type.

19. The voltage converter of claim 15, further comprising an operational amplifier configured to compare the at least one discrete voltage output level against a reference signal, and provide the bias signal to the power amplifier element, where the bias signal represents a difference between the at least one discrete voltage output level and the reference signal.

20. The voltage converter of claim 15, further comprising:
an output voltage drop sense element configured to determine a voltage drop of the discrete voltage output level across the switched capacitor voltage converter, and configured to provide the bias signal to the power amplifier element, where the bias signal is responsive to the voltage drop of the discrete voltage output level.

* * * * *